United States Patent
Yeh et al.

(10) Patent No.: US 11,056,529 B2
(45) Date of Patent: Jul. 6, 2021

(54) IMAGE-SENSOR CHIP-SCALE PACKAGE AND METHOD FOR MANUFACTURE

(71) Applicant: OmniVision Technologies, Inc., Santa Clara, CA (US)

(72) Inventors: Chien-Chan Yeh, Hemei Township (TW); Ying-Chih Kuo, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/600,047

(22) Filed: Oct. 11, 2019

(65) Prior Publication Data
US 2021/0111221 A1 Apr. 15, 2021

(51) Int. Cl.
*H01L 31/062* (2012.01)
*H01L 31/113* (2006.01)
*H01L 27/146* (2006.01)

(52) U.S. Cl.
CPC .... *H01L 27/14687* (2013.01); *H01L 27/1462* (2013.01); *H01L 27/14685* (2013.01); *H01L 27/14692* (2013.01)

(58) Field of Classification Search
USPC ........................................................ 257/291
See application file for complete search history.

(56) References Cited

U.S. PATENT DOCUMENTS

| | | | |
|---|---|---|---|
| 2016/0190204 A1* | 6/2016 | Chiu | H01L 27/14618 438/64 |
| 2016/0252734 A1* | 9/2016 | Rossi | H01L 27/14685 348/340 |
| 2018/0076246 A1 | 3/2018 | Chen et al. | |
| 2019/0165030 A1* | 5/2019 | Wang | H01L 27/1469 |

FOREIGN PATENT DOCUMENTS

CN 103700602 B 6/2016

OTHER PUBLICATIONS

Joshi, M et al., "Molded underfill (MUF) technology for flip chip packages in mobile applications," 2010 Proceedings 60th Electronic Components and Technology Conference (ECTC) pp. 1250-1257.

* cited by examiner

*Primary Examiner* — Niki H Nguyen
(74) *Attorney, Agent, or Firm* — Lathrop GPM LLP

(57) ABSTRACT

A method for fabricating an image-sensor chip-scale package includes bonding, with temporary adhesive, a glass wafer to a device wafer including an array of image sensors. The method also includes forming an isolated-die wafer by removing, from the device wafer, each of a plurality of inter-sensor regions each located between a respective pair of image sensors of the array of image sensors. The isolated-die wafer includes a plurality of image-sensor dies each including a respective image sensor, of the array of image sensors, bonded to the glass wafer. The method also includes encapsulating the isolated-die wafer to form an encapsulated-die wafer; removing, from each of the plurality of image-sensor dies, a respective region of the glass wafer covering the respective image sensor; and singulating the encapsulated-die wafer.

17 Claims, 5 Drawing Sheets

IMAGE-SENSOR CHIP-SCALE PACKAGE AND METHOD FOR MANUFACTURE

BACKGROUND

Camera modules in consumer devices such as stand-alone digital cameras, mobile devices, automotive components, and medical devices are often packaged in a chip-scale package (CSP) that includes a lens assembly and an image sensor. CSPs typically include a cover glass for protecting the image sensor from damage. This protection comes with a cost. Consumers pay a premium for compactness of the aforementioned consumer devices, but the cover glass increases the CSP's height, which confronts device designers with tradeoffs between the value of protecting the image sensor and the cost of its increased size. The cover glass also reduces the amount of light that reaches the image sensor when the camera module captures an image, which in turn degrades image quality.

SUMMARY OF THE EMBODIMENTS

A method for fabricating an image-sensor chip-scale package includes bonding, with temporary adhesive, a glass wafer to a device wafer including an array of image sensors. The method also includes forming an isolated-die wafer by removing, from the device wafer, each of a plurality of inter-sensor regions each located between a respective pair of image sensors of the array of image sensors. The isolated-die wafer includes a plurality of image-sensor dies each including a respective image sensor, of the array of image sensors, bonded to the glass wafer. The method also includes (a) encapsulating the isolated-die wafer to form an encapsulated-die wafer, (b) removing, from each of the plurality of image-sensor dies, a respective region of the glass wafer covering the respective image sensor, and (c) singulating the encapsulated-die wafer.

An image-sensor chip-scale package includes a semiconductor die, an encapsulating layer formed of a molding compound, and a plurality of conductive elements. The semiconductor die has a thickness less than one-hundred micrometers and includes an image sensor configured to detect light incident on a top side of the semiconductor die. The layer is formed of a molding compound and located on a bottom side of the semiconductor die, opposite the top side. Each of the plurality of conductive elements (a) is electrically connected to the image sensor, (b) has a diameter between one hundred and five hundred micrometers, and (c) protrudes through the encapsulating layer.

DETAILED DESCRIPTION OF THE EMBODIMENTS

Figure 1:
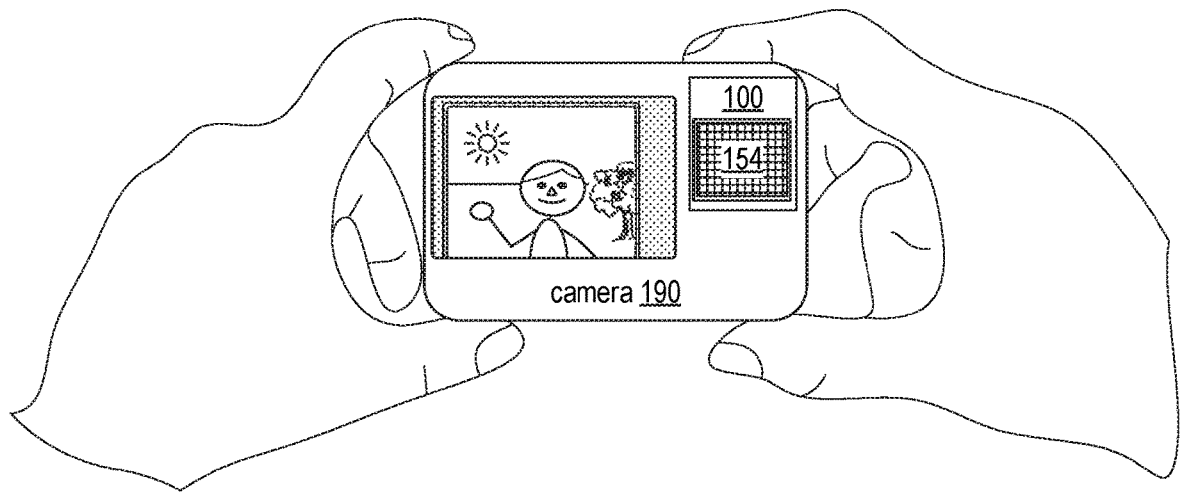
FIG. 1 depicts a camera that includes an image-sensor chip-scale package, in an embodiment.
Figure 2:
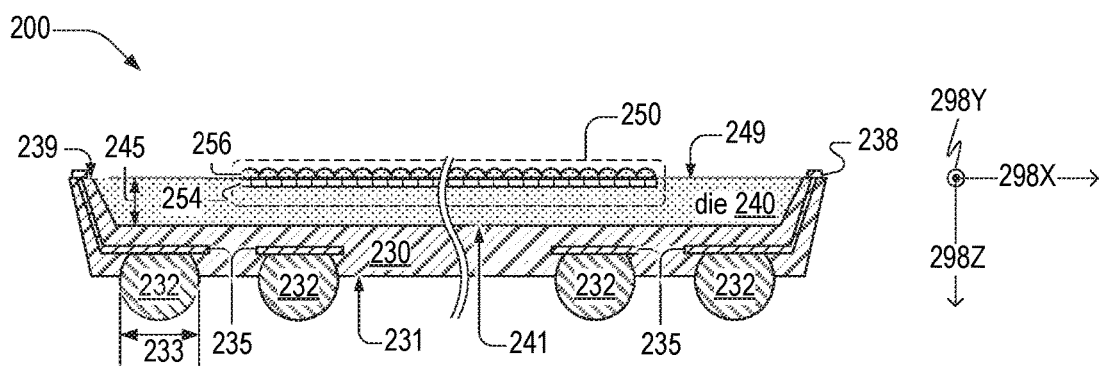
FIG. 2 is cross-sectional schematic view of a first image-sensor chip-scale package, in an embodiment.
Figure 3:
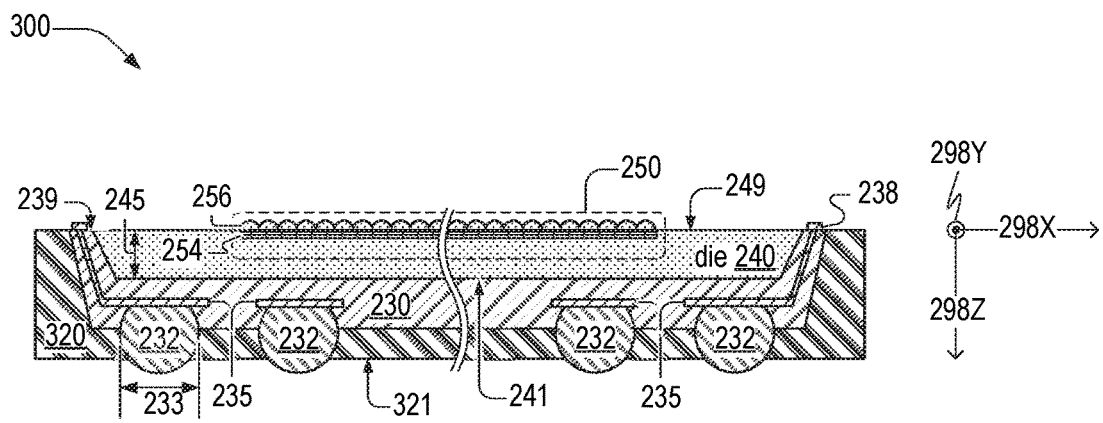
FIGS. 3 and 4 are, respectively, a schematic cross-sectional view and a schematic plan view of a second image-sensor chip-scale package, in an embodiment.
Figure 4:
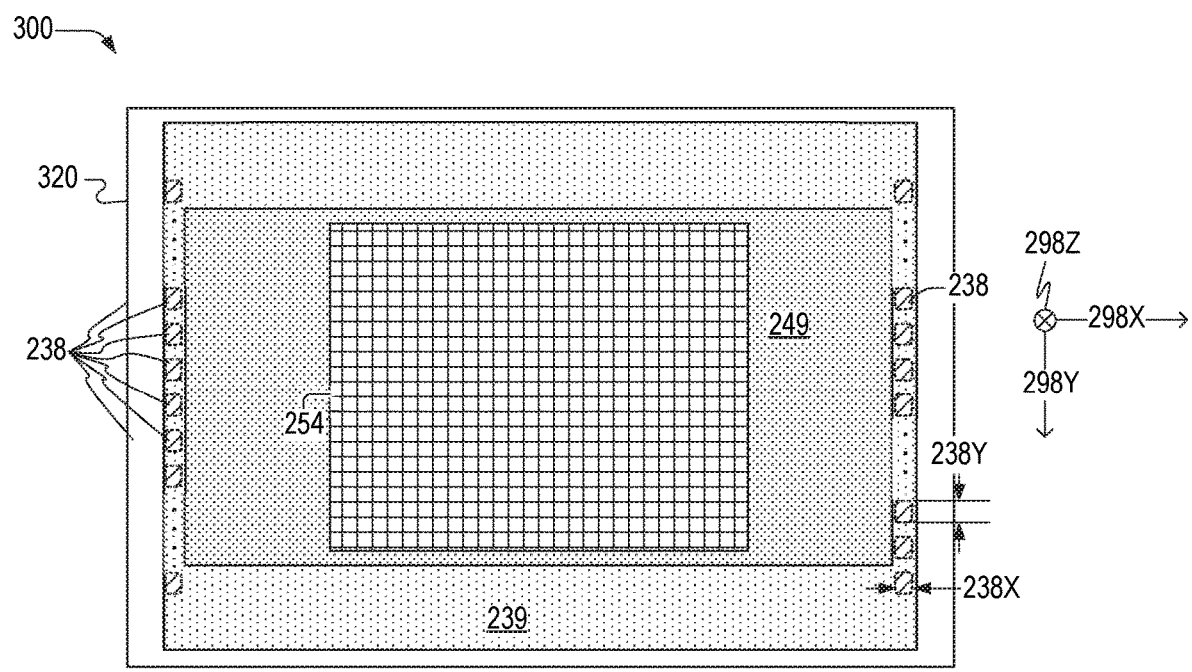

FIG. 1 depicts a camera 190 imaging a scene. Camera 190 includes an image-sensor chip-scale package 100, which includes a pixel array 154. Hereinafter "CSP" denotes "image-sensor chip-scale package." FIGS. 2 and 3 are respective cross-sectional schematics of a CSP 200 and a CSP 300, each of which is an example of CSP 100. The cross-sectional schematics of FIGS. 2 and 3 are each parallel to a plane, hereinafter the x-y plane, formed by orthogonal directions 298X and 298Y, which are each orthogonal to direction 298Z. FIG. 4 is a plan-view schematic of CSP 300. FIGS. 2, 3, and 4 are best viewed together in the following description.

CSP 200 includes a device die 240, a dielectric layer 230, and a plurality of conductive elements 232 protruding through dielectric layer 230. Dielectric layer 230 has a bottom surface 231. CSP 300 is CSP 200 with the addition of an encapsulating layer 320. In embodiments, each conductive element 232 protrudes through bottom surface 321. In embodiments, one or more conductive elements 232 has a bottom surface that is coplanar with bottom surface 321. Dielectric layer 230 and device die 240 have respective top surfaces 239 and 249, each of which may be perpendicular to direction 298Z.

Device die 240 includes an image sensor 250 configured to detect light incident on top surface 249. Dielectric layer 230 is on a bottom surface 241 of device die 240, opposite the top surface 249, such that bottom surface 241 is between dielectric layer 230 and top surface 249. Semiconductor die 240 has a thickness 245 which, in embodiments, is less than one-hundred micrometers.

In embodiments, each conductive element 232 is a solder bump or solder ball, and may form a ball grid array. Each conductive element 232 has a diameter 233, which, in embodiments, is between one hundred and five hundred micrometers.

Image sensor 250 includes a pixel array 254 formed of a plurality of pixels, and is an example of pixel array 154. CSP 200 may also include a microlens array 256. In embodiments, microlens array 256 includes a plurality of microlenses each aligned to a respective one of the plurality of pixels of pixel array 254. Device die 240 may be a semiconductor die, and may be formed of, or include, a semiconductor, such as silicon, germanium, or a combination thereof.

CSP 200 may also include a plurality of bond pads 238, a redistribution layer 235, and a dielectric layer 230. Dielectric layer 230 has a bottom surface 231. Each bond pad 238 may be exposed on at least one of surfaces 239 and 249. Redistribution layer 235 electrically connects pixel array 254 to conductive elements 232 via a respective bond pad 238. Each bond pad 238 has dimensions 238X and 238Y (see FIG. 4), which are each, for example, 100±20 μm. In embodiments, dielectric layer 230 is a solder-mask material, which may be a polymer. A through-silicon via may electrically connect a bond pad 238 to redistribution layer 235, where the via extends partially through device die 240.

Encapsulating layer 320, illustrated in FIGS. 3 and 4, may be formed of an underfill material or a molding compound. Dielectric layer 230 is between encapsulating layer 320 and device die 240. Embodiments where encapsulating layer 320 is a molding compound, instead of an underfill material, benefit from decreased creep strain and decreased failure rates in board-level reliability testing. These benefits become more substantial when thickness 245 of device die 240 is thin, less than one hundred micrometers for example. In embodiments, the molding compound has, at temperatures less than its glass transition temperature $T_g$, a first thermal expansion coefficient $\alpha_1$ less than 15 ppm/K and, at temperatures above $T_g$, a second thermal expansion coefficient $\alpha_2$ less than 30 ppm/K. Transition temperature $T_g$ may be between 140° C. and 180° C. In embodiments, the molding compound may include an inorganic filler, which enables encapsulating layer 320 to have a thermal expansion coefficient closer to that of device die 240. A mass fraction of the inorganic filler in the molding compound may be between seventy and eighty percent. In embodiments, the molding compound has a Young's modulus exceeding 24 GPa and/or includes an epoxy resin, a catalyst, and a release agent. Each of the above candidate features of the molding compound contribute to CSP 300 having improved board-level reliability.

Figure 5:
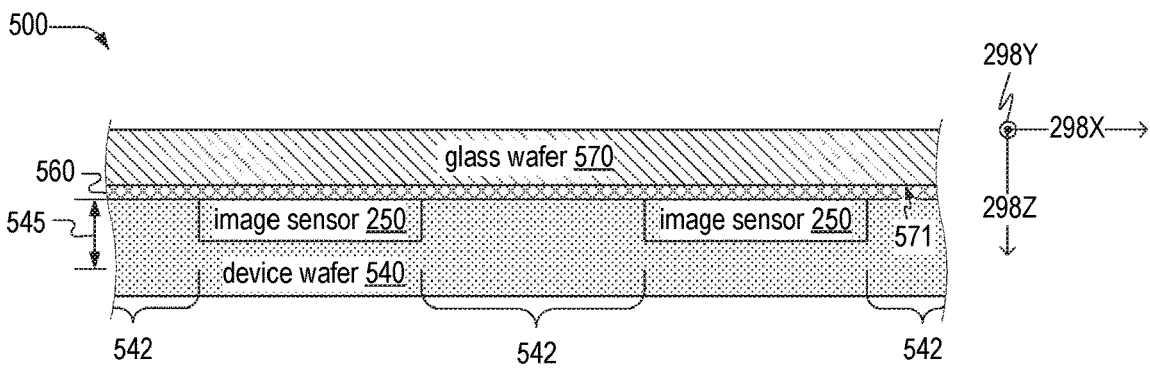
FIG. 5 is a cross-sectional view of a wafer assembly from which the second image-sensor chip-scale package may be formed, in an embodiment.

FIG. 5 is a cross-sectional view of a wafer assembly 500, which includes a glass wafer 570 bonded to a device wafer 540 with a temporary adhesive 560. Device wafer 540 includes an array of image sensors 250, such that device wafer 540 may be singulated to produce a plurality of device dies 240, FIG. 2. Device wafer 540 has a thickness 545 in direction 298Z, which may be less than one hundred micrometers. In FIG. 5, the array of image sensors 250 is parallel to the x-y plane. Glass wafer 570 has a bottom surface 571. In embodiments, temporary adhesive 560 is thermal-release tape. Device wafer 540 includes a plurality of inter-sensor regions 542, each of which is between a respective pair of adjacent image sensors 250.

Figure 6:
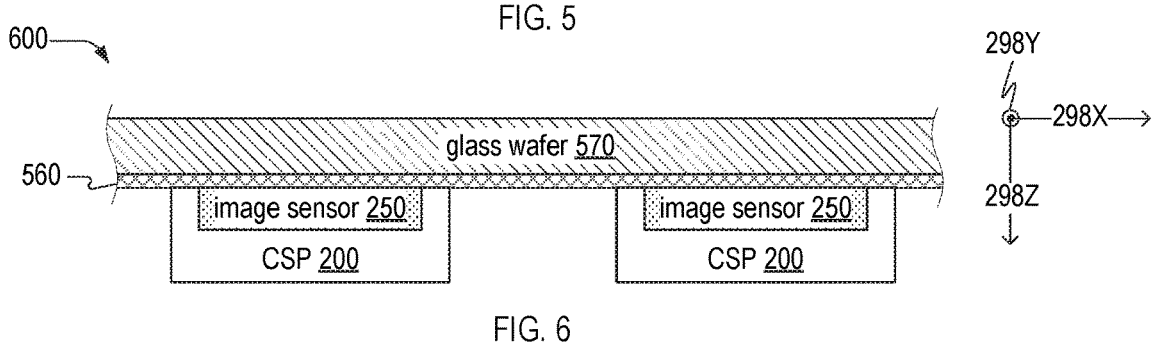
FIG. 6 is a cross-sectional view of an isolated-die wafer, which is the wafer assembly of FIG. 5 after a chip-scale packaging process, in an embodiment.

FIG. 6 is a cross-sectional view of an isolated-die wafer 600, which is wafer assembly 500 after a wafer-level chip-scale packaging process that yields a plurality of CSPs 200 from device wafer 540. The wafer-level chip-scale packaging process includes removing inter-sensor regions 542. Isolated-die wafer 600 includes glass wafer 570 bonded to the plurality of CSPs 200 with temporary adhesive 560. Each CSP 200 has a bottom surface 251 which, in embodiments, includes bottom surface 231 of dielectric layer 230.

Figure 7:
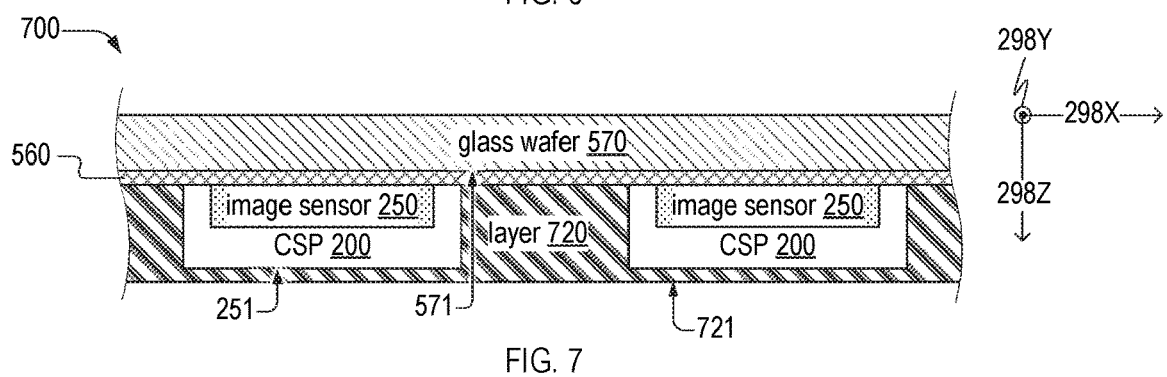
FIG. 7 is a cross-sectional view of an encapsulated-die wafer, which is the isolated-die wafer of FIG. 6 after application of an encapsulating layer, in an embodiment.

FIG. 7 is a cross-sectional view of an encapsulated-die wafer 700, which is isolated-die wafer 600 after application of an encapsulating layer 720. Encapsulating layer 720 may be applied to at least one of: a respective bottom surface 251 of each CSP 200 and temporary adhesive 560. In embodiments, encapsulating layer 720 is also applied to one or more regions of bottom surface 571 between adjacent CSPs 200, e.g., when gaps in temporary adhesive 560 correspond to said regions. Encapsulating layer 720 has a bottom surface 721. In embodiments, conductive elements 232 of each CSP 200 protrude through bottom surface 721, for example, when encapsulating layer 720 is applied via a transfer molding. In embodiments, one or more conductive elements 232 are coplanar with bottom surface 721.

Figure 8:
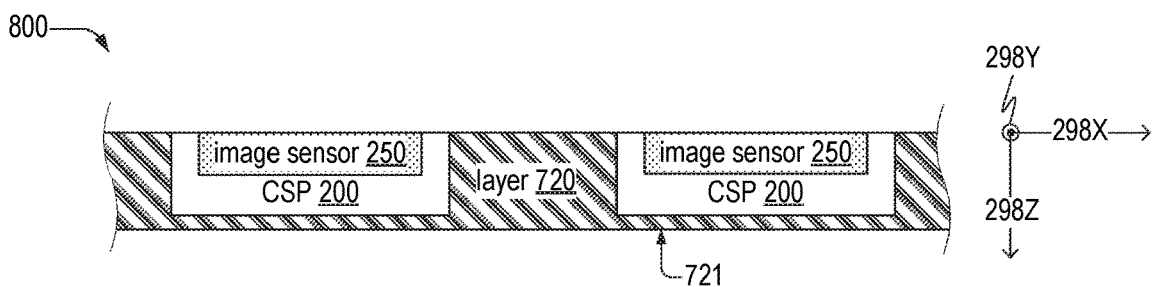
FIG. 8 is a cross-sectional view of a wafer assembly, which is the encapsulated-die wafer of FIG. 7 after removal of a glass wafer therefrom, in an embodiment.

FIG. 8 is a cross-sectional view of a wafer assembly 800, which is encapsulated-die wafer 700 after removal of glass wafer 570. Removal of glass wafer 570 from encapsulated-die wafer 700 may also include removing temporary adhesive 560, such that wafer assembly 800 lacks temporary adhesive 560, as shown in FIG. 8. In embodiments, wafer assembly 800 includes temporary adhesive 560.

Encapsulating layer 720 is analogous to encapsulating layer 320 of CSP 300, and hence has the same material properties of encapsulating layer 320 of CSP 300. Each encapsulating layer 320 corresponds to a respective part of encapsulating layer 720 after singulation of encapsulated-die wafer 700 or wafer assembly 800.

Figure 9:
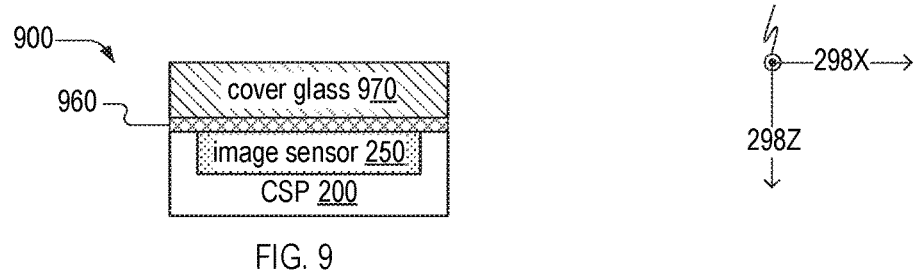
FIG. 9 is a cross-sectional view of an image sensor chip-scale package, a plurality of which are produced via singulation of the encapsulated-die wafer of FIG. 7, in an embodiment.

FIG. 9 is a cross-sectional view of a CSP 900, a plurality of which are produced via singulation of encapsulated-die wafer 700. CSP 900 includes CSP 200 with a cover glass 970 bonded thereto with temporary adhesive 960. Cover glass 970 corresponds to a region of glass wafer 570 bonded to one CSP 200 that remains bonded to the one CSP 200 after singulation of encapsulated-die wafer 700. Temporary adhesive 960 is part of temporary adhesive 560.

Figure 10:
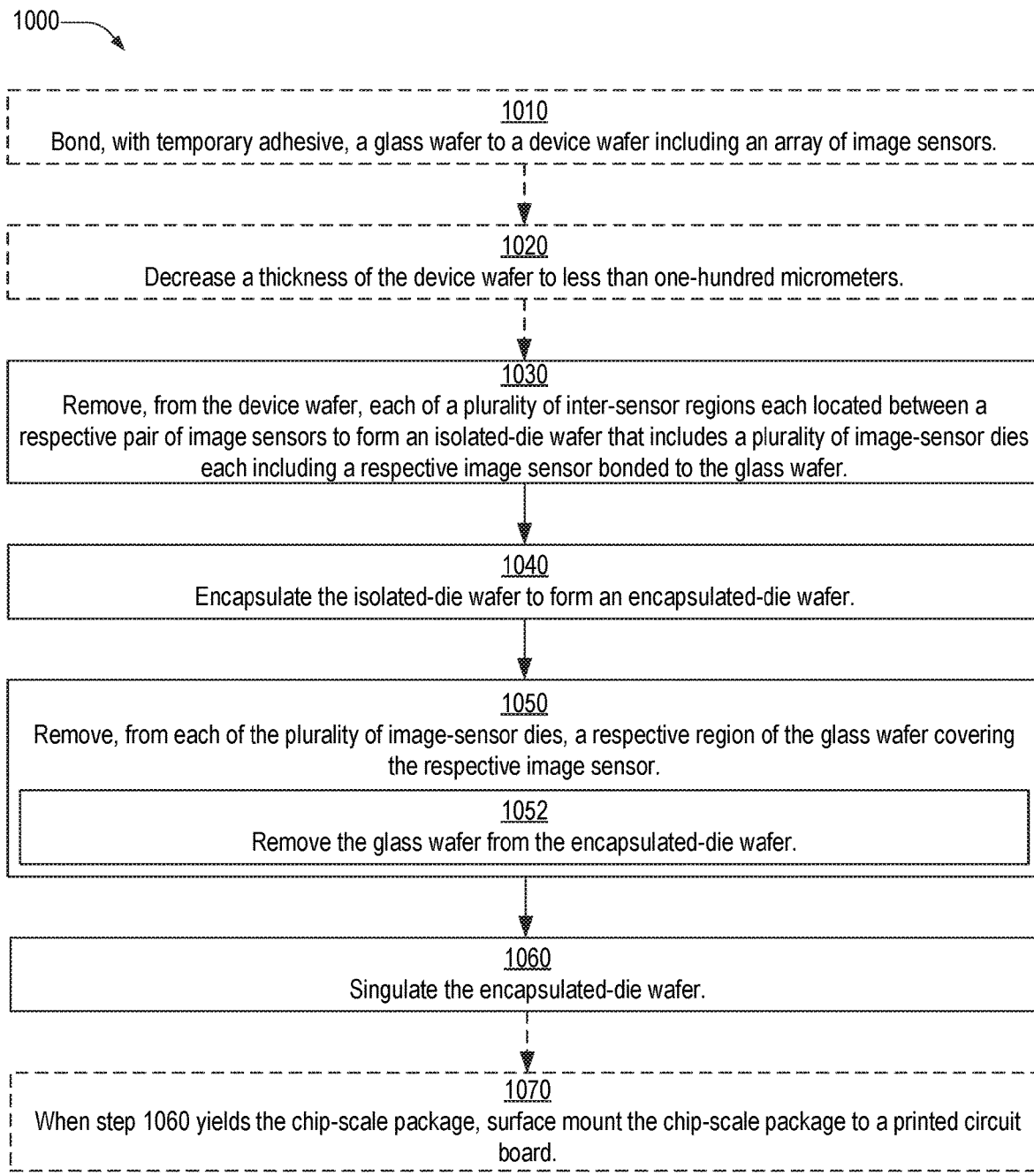
FIG. 10 is a flowchart illustrating a first method for fabricating an image-sensor chip-scale package, in an embodiment.

FIG. 10 is a flowchart illustrating a method 1000 for fabricating an image-sensor chip-scale package. Method 1000 includes steps 1030, 1040, 1050, and 1060. In embodiments, method 1000 also includes at least one of steps 1010, 1020, and 1070.

Step 1010 includes bonding, with temporary adhesive, a glass wafer to a device wafer including an array of image sensors. In an example of step 1010, temporary adhesive 560 bonds glass wafer 570 to device wafer 540.

Step 1020 includes decreasing a thickness of the device wafer to less than one-hundred micrometers. In embodiments, the device wafer is thinned by one of the following processes: mechanical grinding, chemical mechanical polishing (or planarization), wet etching, and an atmospheric downstream plasma dry-chemical etching (ADP-DCE). In an example of step 1020, thickness 545 of device wafer 540 in direction 298Z is decreased to less than one-hundred micrometers.

Step 1030 includes removing, from the device wafer, each of a plurality of inter-sensor regions each located between a respective pair of image sensors of the array of image sensors. This removal of inter-sensor regions yields an isolated-die wafer that includes a plurality of image-sensor dies each including a respective image sensor, of the array of image sensors. Each image-sensor die is bonded to the glass wafer, but otherwise isolated from all other image sensor dies. In an example of step 1030, inter-sensor regions 542 are removed from device wafer 540 to yield isolated-die wafer 600.

Step 1040 includes encapsulating the isolated-die wafer to form an encapsulated-die wafer. In an example of step 1040, isolated-die wafer 600 is encapsulated with encapsulating layer 720, which results in encapsulated-die wafer 700. In embodiments, the encapsulating material is an underfill material. In embodiments, the encapsulating material is a molding compound, which is either compression molded or transfer molded to fill volumes between adjacent isolated dies resulting from step 1030. Step 1040 may include a planarization process, such that the bottom surface of the encapsulating layer (e.g., bottom surface 721) is planar.

Step 1050 includes removing, from each of the plurality of image-sensor dies, a respective region of the glass wafer covering the respective image sensor. In embodiments, step 1050 includes a step 1052 of removing the glass wafer from the encapsulated-die wafer. In such embodiments, a single process step removes each region of the glass wafer from its respective image-sensor die. In an example of steps 1050 and 1052, glass wafer 570 is removed from encapsulated-die wafer 700, which results in wafer assembly 800.

Step 1060 includes singulating the encapsulated-die wafer, which may yield the image-sensor chip-scale package. In an example of step 1060, singulating occurs after execution of step 1052, and wafer assembly 800 is singulated to yield a plurality of CSPs 200. Step 1070 includes surface mounting the image-sensor chip-scale package to a printed circuit board. In an example of step 1070, each of one or more CSPs 200 is surface-mounted to a respective printed circuit board.

Figure 11:
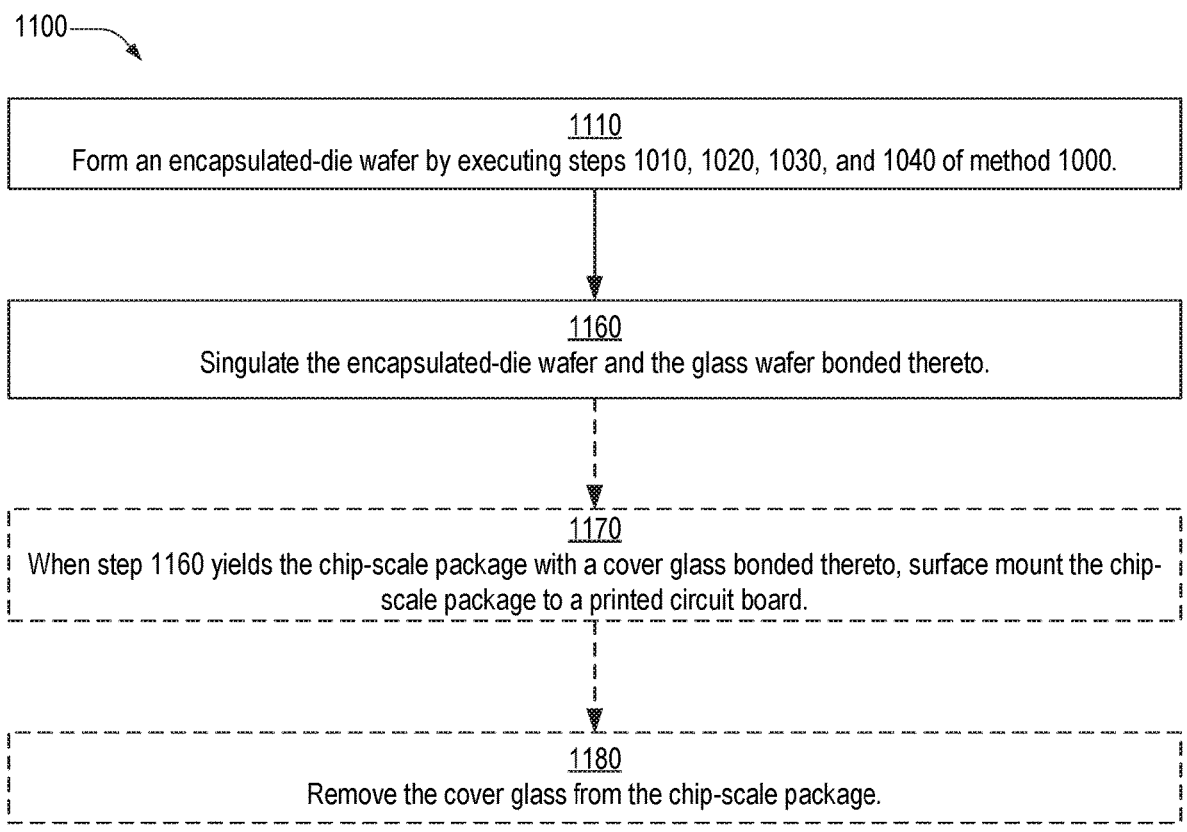
FIG. 11 is a flowchart illustrating a second method for fabricating an image-sensor chip-scale package, in an embodiment.

FIG. 11 is a flowchart illustrating a method 1100 for fabricating an image-sensor chip-scale package. Method 1100 includes steps 1110 and 1160, and, in embodiments, at least one of steps 1170 and 1180.

Step 1110 includes forming an encapsulated-die wafer by executing steps 1010, 1020, 1030, and 1040 of method 1000. In an example of step 1110, encapsulated-die wafer 700 is formed as described in the above description of method 1000.

Step 1160 includes singulating the encapsulated-die wafer and the glass wafer bonded thereto. In embodiments, step 1160 yields the image-sensor chip-scale package with a cover glass bonded thereto. The cover glass corresponds to a respective region of the glass wafer covering the image sensor of the image-sensor chip-scale package produced by step 1160. In an example of step 1160, encapsulated-die wafer 700 is singulated to form a plurality of CSPs 900, FIG. 9.

Step 1170 includes surface mounting the image-sensor chip-scale package to a printed circuit board. In an example of step 1170, each of one or more CSPs 900 is surface-mounted to a respective printed circuit board.

Step 1180 includes removing the cover glass from the image-sensor chip-scale package, and may be executed after step 1170. Step 1180 may also include removing the temporary adhesive from CSP 900. In an example of step 1180, cover glass 970 is removed from CSP 900. In this example, temporary adhesive 960 may be removed as well.

Combinations of Features

Features described above as well as those claimed below may be combined in various ways without departing from the scope hereof. The following enumerated examples illustrate some possible, non-limiting combinations:

(A1) A method for fabricating an image-sensor chip-scale package includes bonding, with temporary adhesive, a glass wafer to a device wafer including an array of image sensors. The method also includes forming an isolated-die wafer by removing, from the device wafer, each of a plurality of inter-sensor regions each located between a respective pair of image sensors of the array of image sensors. The isolated-die wafer includes a plurality of image-sensor dies each including a respective image sensor, of the array of image sensors, bonded to the glass wafer. The method also includes encapsulating the isolated-die wafer to form an encapsulated-die wafer, removing, from each of the plurality of image-sensor dies, a respective region of the glass wafer covering the respective image sensor, and singulating the encapsulated-die wafer.

(A2) In method (A1), said removing a respective region of the glass wafer may include removing the glass wafer from the isolated-die wafer, and said singulating the encapsulated-die wafer may occur after removing the glass wafer from the isolated-die wafer.

(A3) Method (A2) may further include, when the step of singulating yields the image-sensor chip-scale package, and after the step of removing a respective region of the glass wafer and after singulating: surface mounting the image-sensor chip-scale package to a printed circuit board.

(A4) In any method (A1), the step of singulating may occur before the step of removing a respective region of the glass wafer and may include singulating both the encapsulated-die wafer and the glass wafer bonded thereto, and yield the image-sensor chip-scale package with a cover glass bonded thereto, wherein the cover glass corresponds to the respective region of the glass wafer.

(A5) Method (A4) may further include, after the step of singulating and before the step of removing the respective region of the glass wafer, surface mounting the image-sensor chip-scale package to a printed circuit board.

(A6) Any of methods (A1)-(A5) may further include, after the step of bonding, decreasing a thickness of the device wafer to less than one-hundred micrometers.

(A7) In any of methods (A1)-(A6) the step of encapsulating the isolated-die wafer may include encapsulating the isolated-die wafer with a molding compound.

(A8) In any method (A7), the step of encapsulating the isolated-die wafer with a molding compound may include one of compression molding and transfer-molding the molding compound.

(B1) An image-sensor chip-scale package includes a semiconductor die, an encapsulating layer formed of a molding compound, and a plurality of conductive elements. The semiconductor die has a thickness less than one-hundred micrometers and includes an image sensor configured to detect light incident on a top side of the semiconductor die. The layer is formed of a molding compound and located on a bottom side of the semiconductor die, opposite the top side. Each of the plurality of conductive elements (a) is electrically connected to the image sensor, (b) has a diameter between one hundred and five hundred micrometers, and (c) protrudes through the encapsulating layer.

At least one of the following enumerated properties P1-P4 may apply to the molding compound of any of methods (A7) and (A8) and image-sensor chip-scale package (B1):

P1: The molding compound has, at temperatures less than its glass transition temperature $T_g$, a first thermal expansion coefficient $\alpha_1$ less than 15 ppm/K and, and at temperatures above $T_g$, a second thermal expansion coefficient $\alpha_2$ less than 30 ppm/K.

P2: The molding compound has a Young's modulus exceeding 24 GPa.

P3: The molding compound is or includes an epoxy resin, a catalyst, and a release agent.

P4: The molding compound includes an inorganic filler, a mass fraction of the inorganic filler being between seventy and eighty percent.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A method for fabricating an image-sensor chip-scale package comprising:
   bonding, with temporary adhesive, a glass wafer to a device wafer including an array of image sensors;
   after said bonding, decreasing a thickness of the device wafer to less than one-hundred micrometers;
   removing, from the device wafer, each of a plurality of inter-sensor regions each located between a respective pair of image sensors of the array of image sensors, to form an isolated-die wafer that includes a plurality of image-sensor dies each including a respective image sensor, of the array of image sensors, bonded to the glass wafer;
   encapsulating the isolated-die wafer to form an encapsulated-die wafer;
   removing, from each of the plurality of image-sensor dies, a respective region of the glass wafer covering the respective image sensor; and
   singulating the encapsulated-die wafer.

2. The method of claim 1, said removing a respective region of the glass wafer comprising removing the glass wafer from the isolated-die wafer, and said singulating the encapsulated-die wafer occurring after removing the glass wafer from the isolated-die wafer.

3. The method of claim 2, said singulating yielding the image-sensor chip-scale package and further comprising, after said removing a respective region of the glass wafer and after singulating, surface mounting the image-sensor chip-scale package to a printed circuit board.

4. The method of claim 1, said singulating occurring before said removing a respective region of the glass wafer and including singulating both the encapsulated-die wafer and the glass wafer bonded thereto, and yielding the image-sensor chip-scale package with a cover glass both (a) bonded thereto and (b) corresponding to the respective region of the glass wafer.

5. The method of claim 4, further comprising, after said singulating and before said removing the respective region of the glass wafer, surface mounting the image-sensor chip-scale package to a printed circuit board.

6. The method of claim 1, encapsulating the isolated-die wafer comprising encapsulating the isolated-die wafer with a molding compound.

7. The method of claim 6, encapsulating the isolated-die wafer with a molding compound comprising one of compression molding and transfer-molding the molding compound.

8. The method of claim 6, the molding compound having, at temperatures less than its glass transition temperature $T_g$, a first thermal expansion coefficient $\alpha_1$ less than 15 ppm/K and, and at temperatures above $T_g$, a second thermal expansion coefficient $\alpha_2$ less than 30 ppm/K.

9. The method of claim 6, the molding compound having a Young's modulus exceeding 24 GPa.

10. The method of claim 6, the molding compound including an epoxy resin, a catalyst, and a release agent.

11. The method of claim 6, the molding compound including an inorganic filler, a mass fraction of the inorganic filler being between seventy and eighty percent.

12. An image-sensor chip-scale package comprising:
    a semiconductor die having a thickness less than one-hundred micrometers and including an image sensor configured to detect light incident on a top side of the semiconductor die;
    an encapsulating layer formed of a molding compound and located on a bottom side of the semiconductor die, opposite the top side; and
    a plurality of conductive elements each (a) electrically connected to the image sensor, (b) having a diameter between one hundred and five hundred micrometers, and (c) protruding through the encapsulating layer.

13. The image-sensor chip-scale package of claim 12, the molding compound having, at temperatures less than its glass transition temperature $T_g$, a first thermal expansion coefficient $\alpha_1$ less than 15 ppm/K and, and at temperatures above $T_g$, a second thermal expansion coefficient $\alpha_2$ less than 30 ppm/K.

14. The image-sensor chip-scale package of claim 13, transition temperature $T_g$ being between 140° C. and 180° C.

15. The image-sensor chip-scale package of claim 12, the molding compound having a Young's modulus exceeding 24 GPa.

16. The image-sensor chip-scale package of claim 12, the molding compound including an epoxy resin, a catalyst, and a release agent.

17. The image-sensor chip-scale package of claim 12, the molding compound including an inorganic filler, a mass fraction of the inorganic filler being between seventy and eighty percent.

* * * * *